United States Patent [19]
Capilla

[11] Patent Number: 6,137,154
[45] Date of Patent: *Oct. 24, 2000

[54] BIPOLAR TRANSISTOR WITH INCREASED EARLY VOLTAGE

[75] Inventor: Jose M. Capilla, Mesa, Ariz.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 09/017,571

[22] Filed: Feb. 2, 1998

[51] Int. Cl.[7] .................. H01L 27/082; H01L 27/102; H01L 29/70; H01L 31/11; H01L 29/76

[52] U.S. Cl. .................. 257/566; 257/565; 257/571; 257/574; 257/370; 257/378

[58] Field of Search .................. 257/370, 378, 257/273, 565, 566, 571, 575, 574

[56] References Cited

U.S. PATENT DOCUMENTS

| | | | |
|---|---|---|---|
| 4,314,267 | 2/1982 | Bergeron et al. | 257/273 |
| 4,694,562 | 9/1987 | Iwasaki et al. | 437/57 |
| 5,227,654 | 7/1993 | Momose et al. | 257/370 |
| 5,665,615 | 9/1997 | Anmo | 438/202 |
| 5,801,420 | 9/1998 | Fujishima | 257/343 |

*Primary Examiner*—David Hardy
*Assistant Examiner*—Jesse A. Fenty
*Attorney, Agent, or Firm*—Robert F. Hightower

[57] ABSTRACT

An improved bipolar transistor (202) has an increased Early voltage and can be integrated on a semiconductor die with MOS transistors (201) and other types of devices to form an integrated circuit (200). A p-type base region (240) is disposed in an n-type collector region (252). An n-type emitter region (244) is disposed within the base region, and a p-type enhancement region (250) is formed to extend under the emitter region to a depth greater than the base depth. The improved bipolar transistor can be fabricated without significantly affecting the operation of other devices on the integrated circuit.

17 Claims, 2 Drawing Sheets

BIPOLAR TRANSISTOR WITH INCREASED EARLY VOLTAGE

BACKGROUND OF THE INVENTION

The present invention relates in general to integrated circuits, and more particularly to integrated circuit transistors having an increased Early voltage.

Advancements in semiconductor technology have increased the number of transistors which can be manufactured on an integrated circuit die and resulted in a corresponding increase in the functionality of the circuits. In many cases, a single integrated circuit die combines metal-oxide-semiconductor (MOS) field effect transistors for digital processing and bipolar transistors for analog processing on a single die. For example, wireless communications devices such as cellular telephones and pagers may use digital MOS circuits to process incoming and outgoing data while audio signals are processed with analog bipolar circuits.

The increased functionality and operating speed of the digital circuits typically is achieved by fabricating transistors with shallower junctions and smaller surface dimensions, which has the added advantages of reducing die size and power consumption. However, shallower junctions have a disadvantage of reducing the Early voltage, or collector impedance, of bipolar transistors, which lowers circuit performance. The voltage gain of an amplifier stage often is determined by the Early voltage of bipolar transistors.

Prior art integrated circuits that combine MOS and bipolar transistors on a die produce bipolar transistors with low Early voltages and, as a consequence, amplifiers with low gain. These integrated circuits either utilize additional amplifier stages to make up for the reduced gains or increase the complexity of the manufacturing process to increase the Early voltage of the bipolar transistors. Both approaches increases the manufacturing cost of the integrated circuit and the communications device in which it is used.

Hence, there is a need for an integrated circuit transistor and method which increases the Early voltage of a bipolar transistor to increase the performance an integrated circuit without increasing its cost.

DETAILED DESCRIPTION OF THE DRAWINGS

Figure 1:
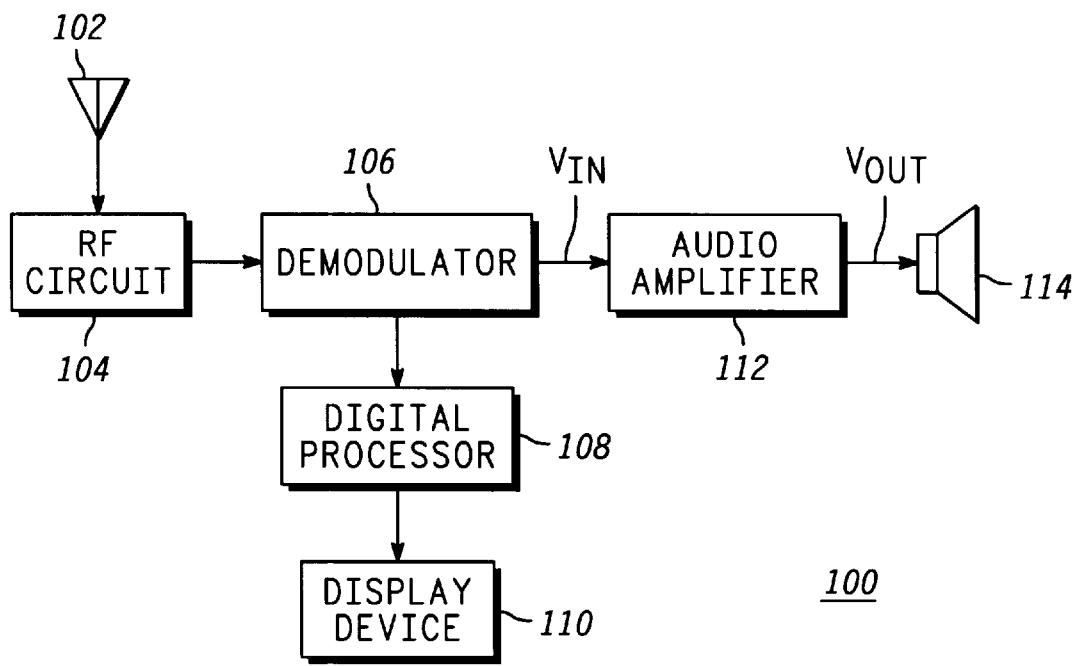
FIG. 1 is a block diagram of a wireless communications device.

FIG. 1 is a block diagram of a wireless communications device 100 such as a cellular telephone, two-way radio or pager. A receiver circuit in communications device 100 includes an antenna 102, a radio frequency (RF) circuit 104 and a demodulator 106. Antenna 102 receives a transmitted RF carrier signal modulated with an audio signal and with digital data. RF circuit 104 amplifies the RF carrier signal and converts the frequency down to an intermediate frequency (IF) signal which is applied to an input of demodulator 106.

Demodulator 106 includes both digital and analog circuitry. Digital data is extracted from the IF signal by demodulator 106 and is applied to an input of a digital processor 108, which contains digital circuitry implemented with metal-oxide-semiconductor (MOS) field-effect transistors for formatting the digital data to drive a display device 110. The audio signal is extracted by demodulator 106 and applied as audio input signal $V_{IN}$ to an audio amplifier 112 for amplification and/or other analog processing to produce an audio output signal $V_{OUT}$ that drives a speaker 114. Audio amplifier 112 includes analog circuits implemented with bipolar transistors. Demodulator 106, digital processor 108 and audio amplifier 112 are fabricated on a single semiconductor die using a combination bipolar-MOS process to form an integrated circuit.

In the figures, elements with the same reference number have similar functionality.

Figure 2:
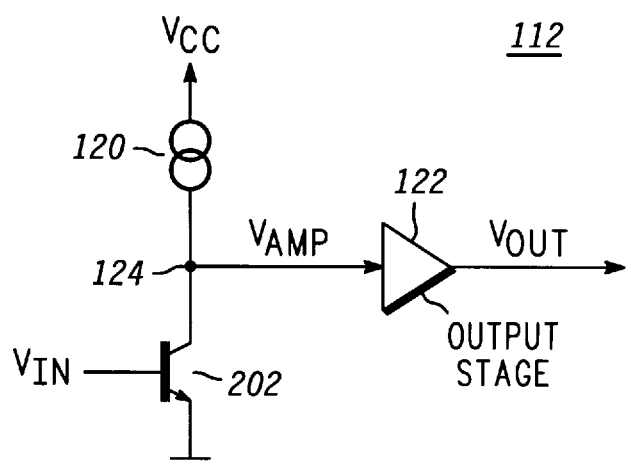
FIG. 2 is a schematic diagram of an audio amplifier.

FIG. 2 is a schematic diagram of audio amplifier 112 having an input for receiving and amplifying audio signal $V_{IN}$ and an output for providing an audio output signal. Audio amplifier 112 includes a gain stage which includes a current source 120 and a bipolar transistor 202, and an output stage 122 configured as shown. To simplify the description, audio amplifier 112 is shown as operating in an open loop mode, current source 120 is assumed to be an ideal current source, output stage 122 has a very high input impedance and $i_{IN}$ has small signal characteristics. It is understood that a variety of other configurations for audio amplifier 112 can be used depending on the requirements of the particular application. For example, it may be advantageous to operate audio amplifier 112 as a closed loop amplifier.

In operation, current source 120 provides a load current from a power supply conductor $V_{cc}$ which flows to the collector of transistor 202 at node 124. Audio signal $V_{IN}$ is amplified through transistor 202 to produce an amplified signal $V_{AMP}$ on node 124. Because current source 120 has an infinite impedance, the voltage gain $A_v$ of the input stage is given by $$A_V = \frac{I_C \cdot Z_C}{kT/q} = \frac{V_{AF} + V_C}{kT/q} \cong \frac{V_{AF}}{kT/q} \quad (\text{For } V_{AF} \gg V_C) \quad (1)$$

where $I_c$ is the collector signal current of transistor 202, $Z_c$ is the collector impedance of transistor 202, k is Boltzmann's constant, T is absolute temperature, q is an electron charge, $V_c$ is the collector voltage and $V_{AF}$ is the Early voltage of transistor 202. It is evident from equation (1) that the maximum gain of amplifier 112 is proportional to the Early voltage. Consequently, transistor 202 is fabricated to have an enhanced Early voltage characteristic in order to provide an adequate voltage gain for amplifier 112.

Output stage 122 buffers $V_{AMP}$ to provide a low output impedance for driving speaker 114 with audio output signal $V_{OUT}$.

Figure 3:
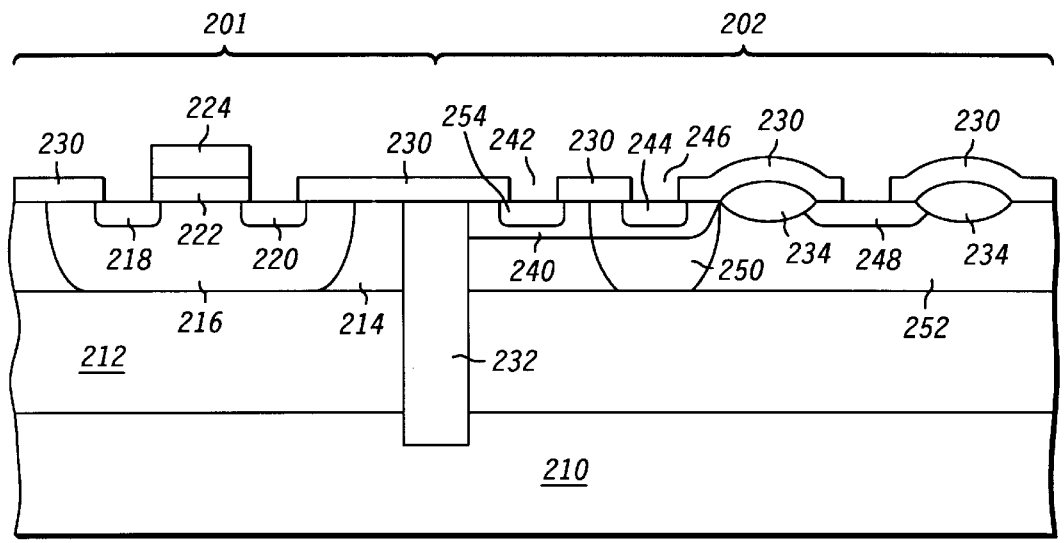
FIG. 3 is a cross section of an integrated circuit.

FIG. 3 is a cross-sectional view of a portion of an integrated circuit 200 manufactured using a combination bipolar-MOS process, including a representative MOS transistor 201 to implement digital circuit functions and a bipolar transistor 202 to implement analog circuit functions. A buried layer 212 is formed by doping a p-type semiconductor substrate 210 with an n-type dopant material such as arsenic, antimony, or phosphorous, to form a low resistivity layer having n-type conductivity and a peak doping concentration of about $10^{19}$ atoms/centimeter$^3$. Buried layer 212 has a thickness of about 2.0 micrometers.

An epitaxial layer 214 having N-type conductivity and a doping concentration of $8 \times 10^{15}$ atoms/centimeter$^3$ is grown on substrate 210 to a thickness of about 3.8 microns. However, during the epitaxial growth the dopant atoms of buried layer 212 diffuse upward about 2.0 microns so that the remaining thickness of epitaxial layer 214 is (3.8−2.0)= 1.8 micrometers.

MOS transistor 201 is an n-channel MOS device disposed in a well region 216 formed by diffusing a p-type dopant such as boron into epitaxial layer 214 as shown. Well region 216 is relatively lightly doped, having a peak doping concentration of about $5\times10^{16}$ atoms/centimeter in order to form an inversion layer that operates as a channel of MOS transistor 201. A source region 218 and a drain region 220 are disposed in well region 216 and doped with n-type material to a concentration of about $3\times10^{19}$ atoms/centimeter$^3$ to operate as the source and drain of MOS transistor 201. A gate dielectric 222 is disposed on the surface to overlap source and drain regions 218 and 220, and a gate electrode 224 is disposed over gate dielectric 222 to invert well region 216 to form a conduction path between source and drain regions 218 and 220 when an enabling voltage is applied from source to gate.

An isolation region 232 is used to electrically isolate transistors from each other. Isolation region 232 typically comprises an insulating material such as silicon dioxide and/or silicon nitride. Alternatively, isolation region 232 can be a region of p-type semiconductor material extending from the surface into substrate 210 which is reverse biased to provide electrical isolation. An insulating layer 230 is disposed on the surface of integrated circuit 200 to protect the devices, with openings as shown to allow electrical contact with transistor electrodes.

Figure 4:
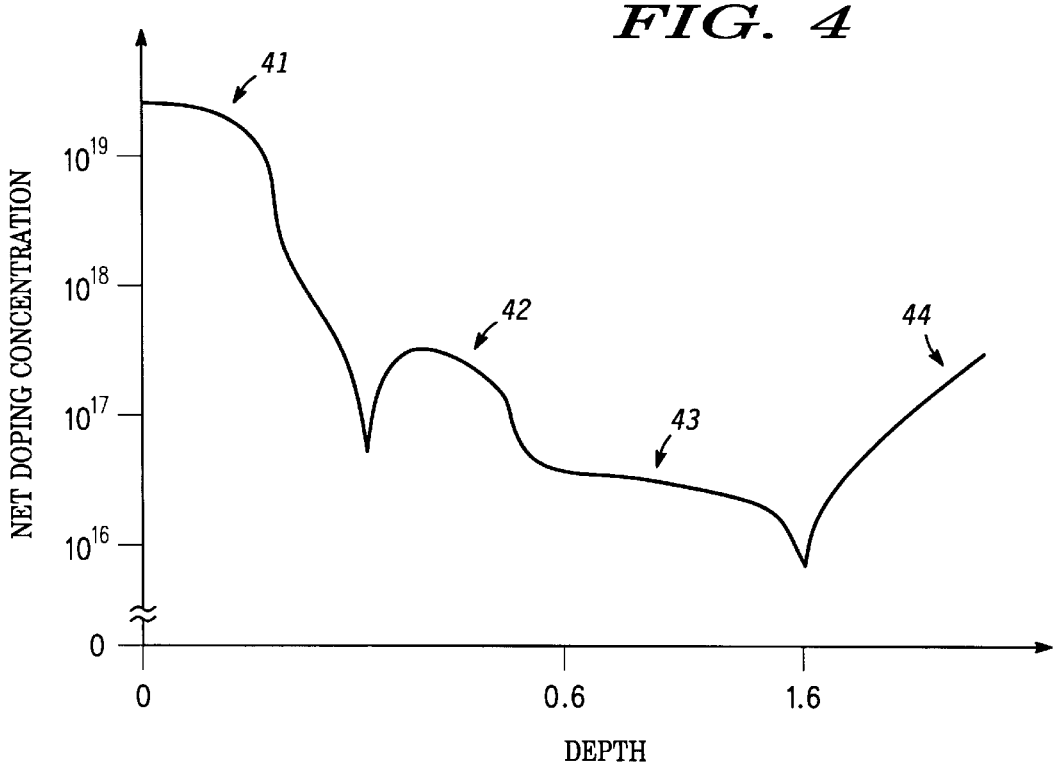
FIG. 4 is a graph of net doping concentration versus depth from the surface of the integrated circuit.

FIG. 4 is a graph of net doping concentration versus depth from the surface of integrated circuit 200 along a vertical line through the center of emitter region 244. The structure and operation of bipolar transistor 202 is best seen by referring to FIG. 4 in conjunction with FIG. 3.

Bipolar transistor 202 is formed in an "epi tub", or a collector region 252 of epitaxial layer 214 which is surrounded by isolation region 232 to provide electrical isolation which allows collector region 252 to operate as a collector of transistor 202. Collector region 252 is contacted through an opening in insulating layer 230 which exposes a collector electrode 248 having a low resistivity n-type doping. Typically, collector electrode 248 is fabricated at the same time and using the same processing steps as source and drain regions 218 and 220 of MOS transistor 201.

A base region 240 is disposed in collector region 252 by diffusing a p-type dopant to a base depth of approximately 0.6 micrometers. The peak base doping concentration is about $2\times10^{17}$ atoms/centimeter$^3$ as shown in FIG. 4 in the portion designated as 42. Where complementary MOS circuits are included in integrated circuit 200, a heavily doped p-type region 254 used for contacting base region 240 is typically fabricated at the same time and using the same processing steps as the source and drain regions of p-channel MOS transistors (not shown). Base region 240 is electrically contacted through an opening 242 in insulating layer 230.

Emitter region 244 is disposed within the base region by diffusing an n-type dopant to a depth less than the base depth. In one embodiment, the emitter depth is 0.3 micrometers. The peak emitter doping concentration is about $3\times10^{19}$ atoms/centimeter$^3$ as shown in FIG. 4 in the portion designated as 41. Emitter region 244 is typically fabricated at the same time and using the same processing steps as source and drain regions 218 and 220 of MOS transistor 201 and collector electrode 248 of bipolar transistor 202. Emitter region 244 is electrically contacted through an opening 246 in insulating layer 230.

Regions 234 are formed with a dielectric material such as silicon dioxide to reduce the collector-base capacitance of transistor 202 and to allow a closer spacing between base region 240 and collector electrode 248.

In many integrated circuit amplifiers such as operational amplifiers, the maximum voltage gain which is achievable is a function of the Early voltage of a transistor in the voltage gain stage. When a collector-base junction is reverse biased, the bias voltage produces an electric field that extends the collector-base depletion region into the base region of the transistor to modulate the effective base width. The Early voltage is a figure of merit that indicates the degree of modulation as a function of a change in the bias voltage. In other words, the Early voltage represents the percentage change in the base width of a transistor caused by a change in the collector-base voltage. A higher Early voltage indicates a smaller proportional variation in the base width and a higher maximum voltage gain of the transistor as the collector-base voltage changes. Moreover, transistors with higher Early voltages operating as current sources are able to produce more constant currents as their voltages are varied. More constant currents make it easier to stabilize the frequency response of an amplifier and control its current consumption, thereby improving amplifier performance.

Bipolar transistors fabricated with processes where device geometries are small and where junctions are shallow typically have Early voltages of 25.0 volts or less because even a small change in base width can represent a large percentage change when the base width is narrow. In the case of transistor 202, the base width is established by an intrinsic base region (the portion of base region 240 lying under emitter region 244) lying between emitter and collector regions 244 and 252. Hence, the effective base width is 0.6−0.3=0.3 micrometers. Because of the interaction between the emitter and base diffusions of bipolar transistor 202 and the fact that emitter region 244 is processed with the same steps as the drain and source of MOS transistor 201, it is difficult to improve the Early voltage by changing the doping characteristics of emitter and base regions 244 and 240 without adversely affecting the operation of transistor 201.

Prior art schemes attempt to address this problem by doping the epitaxial region more lightly to allow more of the collector-base depletion region to extend into the collector rather than the base. However, changing the epitaxial material also can adversely affect the operation of MOS transistors and other devices on the integrated circuit. Other schemes avoid such a global change by selectively replacing the standard base region with one having a different doping concentration. However, this scheme requires an additional masking layer and extra processing steps, which increase the manufacturing cost of the integrated circuit.

To increase the Early voltage of transistor 202 without degrading the operation of other devices, the present invention provides an enhancement region 250 disposed under emitter region 244 to a depth greater than the base depth. Enhancement region 250 has p-type conductivity and lighter doping than base region 240. Preferably, enhancement region 250 is processed with the same masking layer and processing steps as used for well region 216, where enhancement region 250 is formed by diffusing a p-type dopant into collector region 252 while the p-type dopant is diffusing into epitaxial layer 214 to form well region 216. In this embodiment, no extra masking or processing steps are needed. Alternatively, enhancement region 250 can be produced using an additional masking step.

The doping concentration of enhancement region 250 ranges from about 5×10¹⁶ at a depth of 0.6 micrometers to about 2×10¹⁶ at a depth of 1.5 micrometers, which is much lower than that of base region 240, as shown in FIG. 4 in the portion designated as 43. As a consequence of the light doping concentration, enhancement region 250 has little or no effect on the base width of transistor 202, so that the current gain (beta) of transistor 202 is not significantly reduced. Enhancement region 250 is diffused into collector region 252 to a depth that penetrates buried layer 212. The doping concentration of buried layer 212 is shown in FIG. 4 in the portion designated as 44.

Since enhancement region 250 typically is formed at the same time and with the same processing steps as well region 216, the doping profiles are similar. In order to reduce the doping concentration of enhancement region 250 even further without additional processing, the dopant source is masked to diffuse the p-type dopant for enhancement region 250 only through opening 246. This scheme limits the total amount of dopant available to form enhancement region 250 and results in a lower doping concentration than that of well region 216.

In operation, transistor 202 is biased with a reverse bias voltage applied across collector region 252 and base region 240, i.e., the collector-base junction. A reverse bias voltage of more than about 0.5 volts causes substantially all of enhancement region 250 to be depleted of mobile carriers, which greatly increases the width of the depletion region of the collector-base junction. For a given reverse bias voltage, the wider depletion region results in a smaller electric field being applied to base region 240, which produces a more constant base width when the bias voltage changes. The addition of enhancement region 250 more than doubles the Early voltage to a value of about 51.0 volts, resulting in a comparable increase in the gain of an amplifier stage using transistor 202.

An additional benefit of enhancement region 250 is to increase the collector emitter breakdown voltage (BVCEO) from about 11.9 volts to about 16.6 volts. As a consequence of the increased breakdown, transistor 202 is more rugged than prior art transistors. Hence, transistor 202 can be used in buffer stages or output drivers where voltages higher than those that can be applied to other transistors of integrated circuit 200 are needed. As yet another advantage of the present invention, the wider collector-base depletion region of transistor 202 can produce a lower collector-base capacitance than what is achievable with other transistors, depending on the surface geometry of transistor 202.

Hence, an improved transistor has been provided which has an increased Early voltage and is suitable for integrating on a semiconductor die with MOS and other types of transistors to form an integrated circuit. A p-type base region is disposed to a base depth in an n-type collector region. An n-type emitter region is disposed within the base region, and a p-type enhancement region is formed to extend under the emitter region to a depth greater than the base depth. The improved performance of the transistor is achieved without significantly affecting the operation of other devices on the integrated circuit.

What is claimed is:

1. A semiconductor device, comprising:
   a first region having a first doping type;
   a second region disposed in the first region to a first depth, and having a second doping type;
   a third region disposed within the second region; and
   a fourth region disposed in the first region to overlap only a portion of the second region, where the fourth region underlies the third region to a second depth greater than the first depth, and where the fourth region has the second doping type.

2. The semiconductor device of claim 1, further comprising a substrate for disposing the first region.

3. The semiconductor device of claim 1, wherein the fourth region is doped to a concentration lower than a concentration of the second region.

4. The semiconductor device of claim 1, wherein the third region has a third depth less than the first depth.

5. The semiconductor device of claim 1, wherein the first and third regions are formed with N-type semiconductor material, and the second and fourth regions are formed with P-type semiconductor material.

6. The semiconductor device of claim 1, wherein the semiconductor device operates as a bipolar transistor and the first region operates as a collector of the bipolar transistor.

7. The semiconductor device of claim 6, wherein the second region operates as a base of the bipolar transistor.

8. The semiconductor device of claim 7, wherein the third region operates as an emitter of the bipolar transistor.

9. The semiconductor device of claim 8, wherein the fourth region operates as a base of the bipolar transistor.

10. An integrated circuit, comprising a bipolar transistor, including:
    a substrate;
    a collector region disposed on the substrate and having a first doping type;
    an emitter region disposed on the collector region and having the first doping type;
    a base region disposed between the emitter and collector regions to establish a base width of the bipolar transistor, the base region having a second doping type; and
    an enhancement region extending into the collector region and overlapping only a portion of the base region and underlying both the emitter region and a portion of the base region wherein the enhancement region is disposed between the base and collector regions and having the second doping type.

11. The integrated circuit of claim 10, wherein the enhancement region is doped to a concentration lower than a concentration of the base region.

12. The integrated circuit of claim 11, wherein the base region is coupled to the collector region to operate as a collector-base junction of the bipolar transistor and the enhancement region is depleted of carriers when a reverse bias voltage greater than about 0.5 volts is applied across the collector-base junction.

13. The integrated circuit of claim 10, wherein the emitter an collector regions are formed with N-type semiconductor material, and the base and enhancement regions are formed with P-type semiconductor material.

14. The integrated circuit of claim 10, further comprising an epitaxial layer disposed on the substrate, where the collector region is formed in the epitaxial layer.

15. A wireless communications device, comprising:
    a radio frequency (RF) circuit coupled for receiving an RF signal modulated with an audio signal;
    a demodulator having an input coupled to an output of the RF circuit and providing the audio signal at an output;
    an audio amplifier having an input coupled to the output of the demodulator, where the audio amplifier includes at least one bipolar transistor that includes,
    (a) a first region having a first doping type;
    (b) a second region disposed in the first region to a first depth, and having a second doping type;

(c) a third region disposed within the second region; and (d) a fourth region disposed in the first region to overlap only a portion of the second region, the fourth region underlying the third region to a second depth greater than the first depth, where the fourth region has the second doping type.

16. The wireless communications device of claim 15, where said at least one bipolar transistor further comprises a semiconductor substrate for disposing the first region.

17. The wireless communications device of claim 15, wherein the fourth region is doped to a concentration lower than a concentration of the second region.

* * * * *